(12) United States Patent
Laengle

(10) Patent No.: US 11,647,288 B2
(45) Date of Patent: May 9, 2023

(54) DEVICE FOR MEASURING MASKS FOR MICROLITHOGRAPHY AND AUTOFOCUSING METHOD

(71) Applicant: Carl Zeiss SMT GmbH, Oberkochen (DE)

(72) Inventor: Mario Laengle, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 197 days.

(21) Appl. No.: 16/912,837

(22) Filed: Jun. 26, 2020

(65) Prior Publication Data

US 2020/0412939 A1 Dec. 31, 2020

(30) Foreign Application Priority Data

Jun. 27, 2019 (DE) .......................... 102019117293.4

(51) Int. Cl.
*G06T 7/00* (2017.01)
*H04N 23/67* (2023.01)
(Continued)

(52) U.S. Cl.
CPC .............. *H04N 23/67* (2023.01); *G02B 7/28* (2013.01); *G06T 7/0004* (2013.01); *G06T 7/60* (2013.01);
(Continued)

(58) Field of Classification Search
CPC ........ H04N 5/23212; G02B 7/28; G02B 7/38; G02B 21/006; G02B 21/244;
(Continued)

(56) References Cited

U.S. PATENT DOCUMENTS 6,124,924 A 9/2000 Feldman et al.
6,688,565 B1 2/2004 Chen
(Continued)

FOREIGN PATENT DOCUMENTS

CN 102844705 4/2017 ............. G03B 13/36
CN 106772923 5/2017 ............... G02B 7/28
(Continued)

OTHER PUBLICATIONS

Notice of Reasons for Rejection issued by the Korean Intellectual Property Office for Korean patent application 10-2020-0078351, dated Oct. 28, 2021 (with English Translation).
(Continued)

*Primary Examiner* — Stephen P Coleman
(74) *Attorney, Agent, or Firm* — Fish & Richardson P.C.

(57) ABSTRACT

The invention relates to a device for measuring a mask for microlithography, the device including an imaging device and an autofocusing device. The imaging device comprises an imaging optical unit with a focal plane for imaging the mask, an object stage for mounting the mask, and a movement module for producing a relative movement between object stage and imaging optical unit. The autofocusing device is configured to generate a focusing image by way of the imaging of a focusing structure in a focusing image plane intersecting the focal plane, in which the focusing structure is embodied as a gap. Furthermore, the invention relates to an autofocusing method for a device for measuring a mask for microlithography.

34 Claims, 5 Drawing Sheets

(51) Int. Cl.
*G02B 7/28* (2021.01)
*G06T 7/60* (2017.01)

(52) U.S. Cl.
CPC .......... *G06T 2207/10148* (2013.01); *G06T 2207/30148* (2013.01)

(58) Field of Classification Search
CPC ....... G02B 21/245; G06T 7/0004; G06T 7/60; G06T 2207/10148; G06T 2207/30148; G03F 1/84; G03F 9/7026
USPC ...................................................... 348/222.1
See application file for complete search history.

(56) References Cited

U.S. PATENT DOCUMENTS

| | | | |
|---|---|---|---|
| 7,142,315 B1 | 11/2006 | Lange et al. | |
| 2010/0247085 A1 | 9/2010 | Shiratsuchi et al. | |
| 2011/0134308 A1* | 6/2011 | Arnz | G02B 21/245 348/E5.045 |
| 2013/0016275 A1 | 1/2013 | Hokoi | |
| 2013/0062501 A1 | 3/2013 | Perlitz et al. | |
| 2014/0168404 A1 | 6/2014 | Westphal et al. | |
| 2016/0104275 A1* | 4/2016 | Arnz | G06T 7/001 382/151 |
| 2018/0306733 A1 | 10/2018 | Nakashima | |

FOREIGN PATENT DOCUMENTS

| | | | | |
|---|---|---|---|---|
| DE | 10153113 | 3/2003 | ............... | G01C 3/32 |
| DE | 102011082414 | 3/2013 | ............... | G02B 7/36 |
| DE | 102012223128 | 6/2014 | ............. | G02B 21/24 |
| DE | 102016120730 | 2/2018 | ............... | G02B 7/28 |
| JP | 2001-318302 | 11/2001 | ............... | G02B 7/28 |
| JP | 2009-31169 | 2/2009 | ............. | G01B 11/00 |
| JP | 2010-230405 | 10/2010 | .......... | G01N 21/956 |
| JP | 2013-29579 | 2/2013 | ............... | G02B 7/28 |
| JP | 5293782 B2 * | 9/2013 | ........... | B23K 26/032 |
| KR | 1020130014018 | 2/2013 | ............. | B23K 26/03 |
| TW | 200937145 | 9/2009 | ............... | G03F 9/00 |
| TW | 201839519 | 11/2018 | ............... | G03F 7/20 |

OTHER PUBLICATIONS

The First Office Action and Search Report issued by the Taiwan Patent Office for Application No. TW 109121561, dated Dec. 27, 2021 (with English Translation).
The German Office Action for German Application No. DE 10 2019 117 293.4, dated Feb. 17, 2020 (English Translation).
The Notification of Reasons for Rejection issued by the Japanese Patent Office for Japanese Application No. 2020-110384, dated Aug. 25, 2021 (with English Translation).
The Notice of Reasons for Refusal issued by the Japanese Patent Office for Application No. JP 2020-110384, dated Jun. 20, 2022 (with English Translation).
The Notice of Reasons for Refusal issued by the Japanese Patent Office for Application No. JP 2020-110384, dated Jun. 20, 2022 (English Translation Only).
The First Office Action and Search Report issued by the Chinese Patent Office for Application No. CN 202010593805.7, dated Nov. 2, 2022 (With English Translation).
The Notice of Final Rejection issued by the Korean Patent Office for Application No. KR 10-2020-0078351, dated Nov. 18, 2022 (with English Translation).
The Written Decision on Dismissal of Amendment by the Korean Patent Office for Application No. KR 10-2020-0078351, dated Nov. 18, 2022 (with English Translation).
The Re-Examination Decision of Rejection issued by the Korean Intellectual Property Office for Application No. KR 10-2020-0078351, dated Nov. 18, 2022 (English Translation Only).
The Decision to Dismiss Amendment issued by the Korean Intellectual Property Office for Application No. KR 10-2020-0078351, dated Nov. 18, 2022 (English Translation Only).
Decision of Rejection issued by the Korean Intellectual Property Office for Application No. KR 10-2020-0078351, dated Jul. 26, 2022 (English Translation Only).

* cited by examiner

DEVICE FOR MEASURING MASKS FOR MICROLITHOGRAPHY AND AUTOFOCUSING METHOD

CROSS-REFERENCE TO RELATED APPLICATIONS

This application claims priority under 35 U.S.C. § 119 from German Application No. DE 10 2019 117 293.4, filed on Jun. 27, 2019, the entire contents of which are incorporated herein by reference.

TECHNICAL FIELD

The invention relates to a device for measuring masks for microlithography and to an autofocusing method.

BACKGROUND

Autofocusing devices and autofocusing methods are generally used to position an object in a focal plane of an imaging optical unit. In the case of a constant focal length of the imaging optical unit, it is necessary to adapt the distance between imaging optical unit and object to be imaged in such a way that the object is situated in a focal plane of the imaging optical unit in order to generate an image of sufficient quality. From camera technology, in particular, for a few decades now autofocusing methods have already been known in which an optimization of the focus setting is performed for example by means of a contrast evaluation of a recorded image in a plurality of iteration steps. In order to achieve a rapid setting of the optimum focal length, the prior art likewise discloses methods in which, by means of a structure projected onto the object to be imaged, an evaluation is performed to the effect that a current deviation from the desired focal plane is ascertained directly, whereupon the imaging optical unit can subsequently be set appropriately in one step, as a result of which further iteration steps are obviated.

The published German patent application DE 10 2011 082 414 A1 describes a corresponding system for an apparatus for inspecting masks for semiconductor lithography.

The system disclosed therein is based on a periodically structured focusing image being projected into a focusing image plane by means of an autofocusing device, said focusing image plane intersecting the focal plane of the imaging optical unit of the system.

In the published German patent application DE 10 2016 120 730 A1, attributed to the present applicant, instead of a periodically structured focus image, a non-periodic focus image is projected into a focusing image plane that intersects the focal plane of the imaging optical unit of the system.

During focusing by means of the autofocusing methods described in the cited documents, if the lithography masks determined have periodic and/or non-periodic structures, disturbing Moiré effects can occur, as a result of which the measurement is made more difficult or even corrupted.

SUMMARY

In a general aspect, the present invention provides a device which solves the above-described disadvantages of the prior art. A further aspect of the invention is to specify a method for determining the focusing in a device for measuring masks in microlithography.

These aspects are achieved by means of a device and a method having the features of the independent claims. The dependent claims relate to advantageous developments and variants of the invention.

A device according to the invention for measuring a mask for microlithography has an imaging device, wherein the imaging device comprises
- an imaging optical unit with a focal plane for imaging the mask,
- an object stage for mounting the mask, and
- a movement module for producing a relative movement between object stage and imaging optical unit.

Furthermore, the imaging device comprises an autofocusing device, by means of which a focusing image can be generated. The focusing image is generated by way of the imaging of a focusing structure in a focusing image plane intersecting the focal plane. According to the invention, the focusing structure is embodied as a gap. The embodiment of the focus structure as a gap has the advantage that Moiré effects that can make it more difficult or even impossible to evaluate the focus structure imaged by the imaging optical unit cannot occur even in the case of reflection at lithography masks with their typically periodic structures. The gap is imaged on the structures of the mask as a so-called focus caustic. In this case, a focus caustic is understood to mean an at least partly unsharp imaging of the gap.

In one variant of the invention, a plurality of gaps can be imaged on the focus structure, which gaps can be arranged in particular in a manner rotated with respect to one another in order to avoid a possible Moiré effect. This advantageously affords the possibility of averaging over the imaging of the plurality of gaps and of thus reducing possible measurement inaccuracies caused by inhomogeneities.

In one variant of the invention, the movement module can be configured to move the object stage and thus the mask during focusing. This has the advantage that possible inhomogeneities of the mask can be compensated for.

In particular, the movement module can be configured to move the object stage and with it the mask during focusing obliquely, in particular diagonally with respect to the orientation of the imaging of the gap. The preferred orientation of the structures on lithography masks is perpendicular to one another in the x-direction and y-direction; by means of a diagonal movement of the mask with respect to the orientation of the imaging of the gap, which runs in the x-direction or y-direction of the mask, it is possible to compensate equally for possible inhomogeneities of the mask in the x- and y-directions. An autofocusing method according to the invention for a device for measuring a mask for microlithography with an imaging device with an imaging optical unit comprises the following method steps:

a) imaging a focusing structure embodied as a gap in a focusing image plane on the mask, said focusing image plane intersecting a focal plane of the imaging optical unit, b) recording a focus caustic of the focusing structure that results from step a), c) determining the distance between a focal plane of the imaging device and a surface of the mask on the basis of the recording of the focus caustic, d) moving the mask by the distance ascertained from method step c), and e) repeating steps a) to d) until the distance is smaller than a predetermined value.

The image of the focus caustic imaged by the imaging device can be recorded for example by a CCD area sensor of a CCD camera arranged in the imaging plane of the imaging optical unit.

In one variant of the method, a caustic center can be determined as a location of the highest intensity in the focus caustic of the gap; likewise, a caustic center can be determined as a location of the narrowest constriction in the imaged focus caustic of the gap.

Furthermore, the focusing structure can comprise a plurality of gaps and the distance between the focal plane of the imaging device and the surface of the mask can be determined by means of an evaluation of the caustic centers of the imagings of the gaps. This has the advantage that local aberrations, such as imaging aberrations, for example, are averaged out and the determination of the best focus is less susceptible to aberrations and is thus stabler.

In one variant of the invention, a reference line can be formed in the recording of the focus caustic, said reference line denoting those locations at which the caustic center would lie given an optimum position of the mask in the focal plane. The position of the reference line can be determined by an alternative focusing method, for example, which is based on a contrast measurement or a phase measurement, for example.

Furthermore, the distance between the surface of the mask and the focal plane can be determined from the distance between the caustic center and the reference line. In this regard, after ascertaining the caustic center in the image of the focus caustic, the distance with respect to the reference line and thus the offset with respect to the focal plane can be ascertained rapidly.

Furthermore, the mask can be moved during the focus measurement obliquely, in particular diagonally with respect to the orientation of the imaging of the gap, as a result of which inhomogeneities of the mask can be compensated for. Such a movement makes it possible to compensate for inhomogeneities both in the x-direction and in the y-direction, which correspond to the preferred directions of the structures on lithography masks.

In one variant of the method, the imaging of the focus caustic can be normalized before the evaluation, which can likewise compensate for inhomogeneities of the mask.

In particular, the normalization is effected by matching the energy per image line of an image of the focus caustic of the gap. The image is recorded by the CCD camera of the device and then all image lines are adapted in terms of their intensity profile such that the sum of the energy over the imaged line is identical for each imaged line.

BRIEF DESCRIPTION OF DRAWINGS

Exemplary embodiments and variants of the invention are explained in more detail below with reference to the drawing. In the figures.

DETAILED DESCRIPTION

Figure 1:
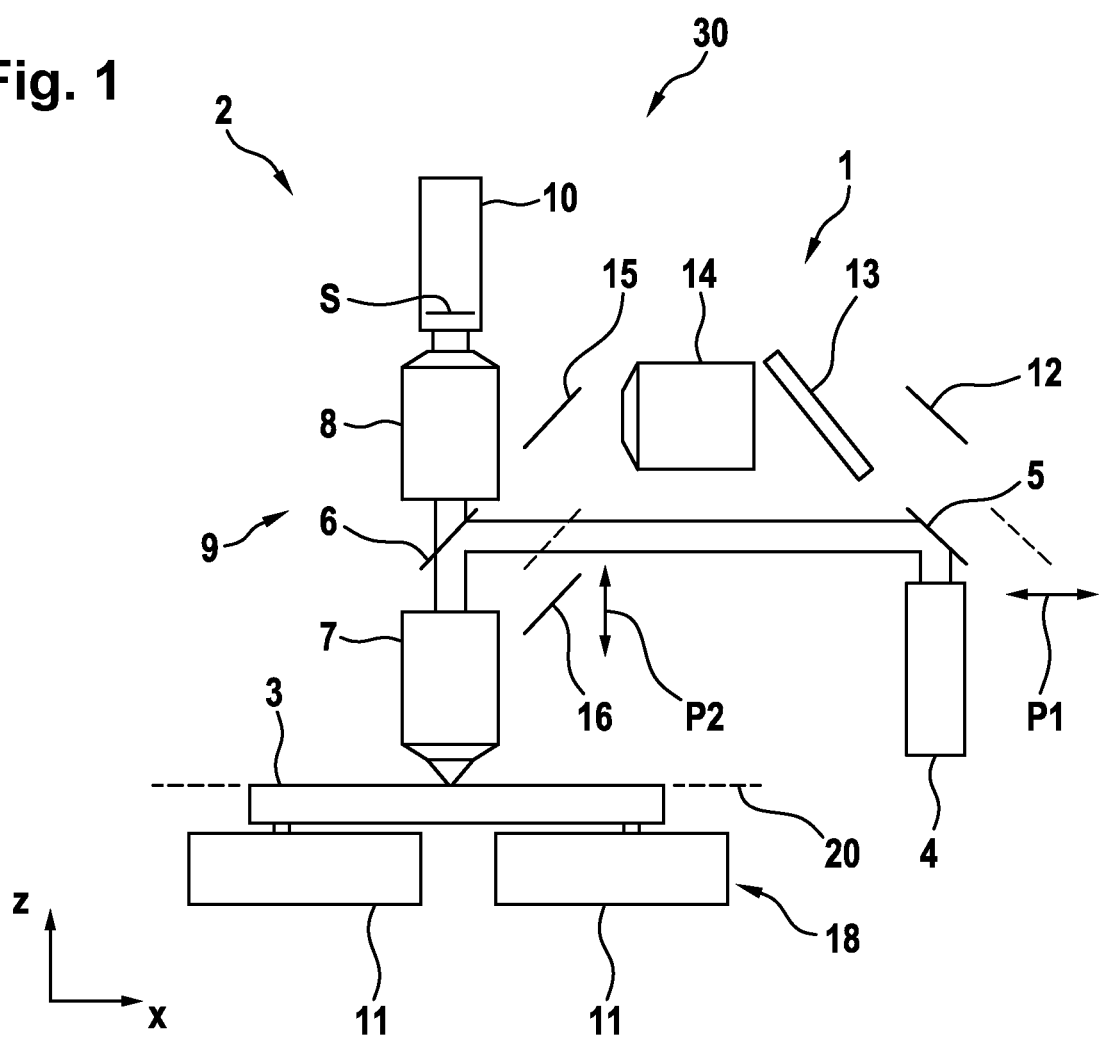
FIG. 1 shows a first embodiment of the autofocusing device according to the invention, integrated into an imaging device.
Figure 2:
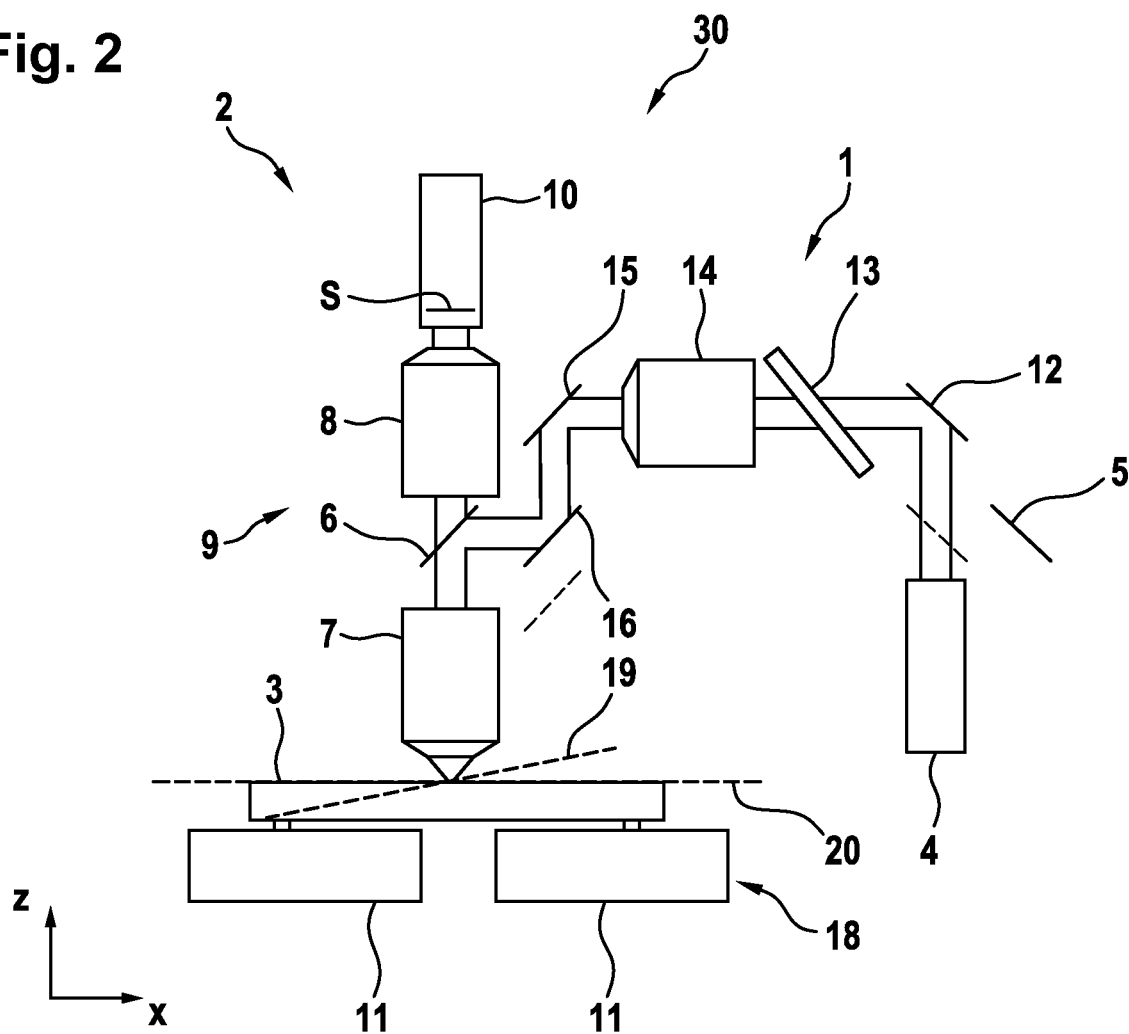
FIG. 2 shows a further illustration of the first embodiment of the autofocusing device according to the invention.

FIG. 1 shows a first embodiment of the device 30 according to the invention for measuring masks for semiconductor lithography in the normal operating mode, and FIG. 2 shows a further illustration of this embodiment of the device 30 according to the invention during an ongoing autofocusing method.

FIG. 1 shows the device 30 according to the invention with an imaging device 2 and an autofocusing device 1 for examining objects in the form of lithography masks 3. The device 30 for measuring masks 3 for microlithography in FIG. 1 furthermore comprises an illumination source 4, which emits incoherent or partly incoherent illumination radiation. The illumination radiation is guided via a first deflection mirror 5 and a second deflection mirror 6 to the imaging objective 7 and is directed by means of the latter onto the lithography mask 3 for illumination purposes. The lithography mask 3 is imaged by way of the imaging objective 7, the partly transparent second deflection mirror 6 and also a tube optical unit 8, which together form an imaging optical unit 9, onto a CCD camera 10 in order to generate an image of a part of the mask 3. By way of example, the lateral position of alignment marks of the mask 3 can be determined highly accurately by means of the imaging device 2 embodied as a microscope. The imaging device 2 furthermore has an object stage 11, by means of which the mask 3 can be positioned both laterally in the y-direction, that is to say perpendicular to the plane of the drawing, and in the x-direction and also in the observation direction, that is to say in the z-direction. The object stage 11 includes a movement module 18 for relative movement of object stage 11 and imaging optical unit 9. Alternatively, the movement module 18 can be embodied such that the object stage 11 is moved only in the x- and y-directions and the imaging optical unit 9 is moved in the z-direction. Moreover, by way of example, only the imaging optical unit 9 can be moved in the x-, y- and z-directions or the object stage 11 can be moved in the x-direction and the imaging optical unit 9 can be moved in the y-direction and the z-direction.

The autofocusing device 1 uses the illumination source 4 and also the imaging objective 7 of the imaging device 2 for illuminating the mask 3 with a focusing image and uses the imaging objective 7, the tube optical unit 8 and the CCD camera 10 for recording the focusing image imaged on the mask 3. To that end, the first deflection mirror 5 is displaceable (indicated by double-headed arrow P1), such that it can be moved out of the beam path of the illumination radiation coming from the illumination source 4, as is shown in FIG. 2. Alternatively, the first deflection mirror 5 can also be embodied as partly transmissive, wherein the position of the fourth deflection mirror 16 is then a factor in deciding whether or not the focusing structure 13 is imaged. Therefore, the illumination radiation in this case (FIG. 2) impinges on a third deflection mirror 12, which directs the illumination radiation through a focusing structure 13 tilted by 45° relative to the direction of propagation of the illumination radiation. However, the tilt angle can also be any other angle from a range of greater than 0° and less than 90°.

The grating structure is imaged onto the mask 3 by way of an autofocus optical unit 14, two further deflection mirrors 15, 16, the second deflection mirror 6 and also the imaging objective 7. In this case, the deflection mirror 16 is provided such that it is movable (double-headed arrow P2)

in such a way that it is movable from the first position shown in FIG. 1 into the second position shown in FIG. 2, in order to enable the focusing image to be imaged on the mask 3. Alternatively, the deflection mirror 16 can also be tilted. The focusing structure 13 can be embodied for example as a single gap or a plurality of gaps rotated with respect to one another, wherein the gaps extend primarily in the x/z-plane, that is to say in the plane of the drawing. As a result of the inclination of the focusing structure 13 and the reduced imaging of the focusing structure 13 into the focusing image plane 19 by means of the autofocus optical unit 14, the focusing image plane 19, in which the focusing image lies, intersects the focal plane 20 of the imaging optical unit 9 of the imaging device 2 at an acute angle of a few degrees. In the case of the illustration shown in FIG. 2, it is assumed that the surface of the object 3 is positioned exactly in the focal plane 20. The focusing structure 13 imaged on the mask 3, and thus the focusing image is reflected at the mask 3 and imaged into the detector plane of the CCD area sensor S by means of the imaging optical unit 9.

Figure 3:
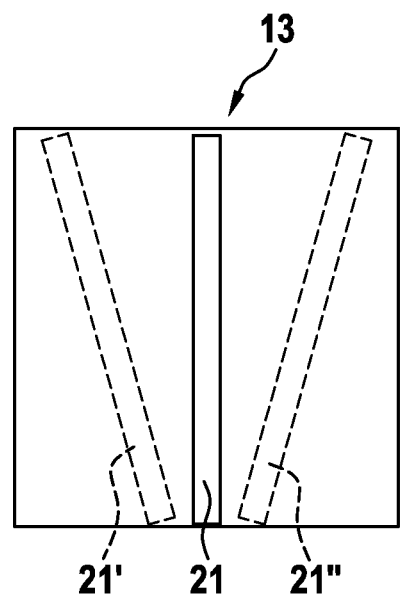
FIG. 3 shows one embodiment of a focusing structure according to the invention.

FIG. 3 shows one embodiment of a focusing structure 13 according to the invention, where a gap 21 is formed in the center of the focusing structure 13. In each case on a side of the gap 21, illustrated as dashed lines, in each case a further optional gap 21', 21" is illustrated, which are embodied in a manner rotated with respect to the gap 21 in the plane usually in each case at an angle of greater than or equal to 0 to 90 degrees, in particular at an angle of greater than or equal to 5 to 45 degrees. In the case of a plurality of gaps 21, 21', 21", the focus position of the mask can be determined by averaging the results obtained for the individual gaps 21, 21', 21". Moiré effects that can disturb the determination of the relative position of the mask 3 with respect to the focal plane 20 are avoided as a result of the inclination of the gaps 21, 21', 21" with respect to one another.

Figure 4A:
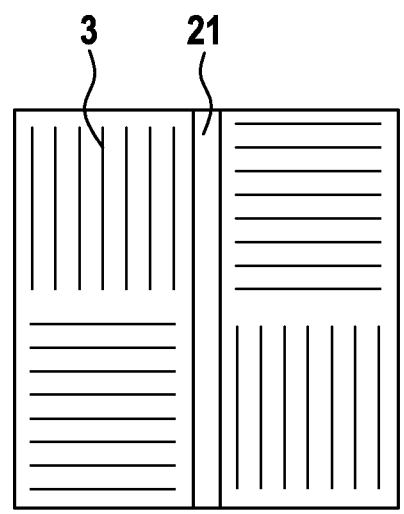
FIG. 4A shows one example of an image of the imaged mask.

FIG. 4A shows an imaging of the gap 21 onto a mask 3 such as would result if the focusing structure 13 were not inclined, that is to say were perpendicular to the optical axis of the autofocus optical unit 14, and if the surface of the mask 3 coincided with the focal plane 20. In the example shown, the gap 21 is imaged sharply. If the surface of the mask 3 did not coincide with the focal plane, but rather were offset parallel by a specific value, the gap 21 would be represented with a largely homogeneous unsharpness over its entire length. From such a representation, however, it is not possible to perform a quantitative determination of the offset of the surface of the mask 3 in relation to the focal plane 20.

Figure 4B:
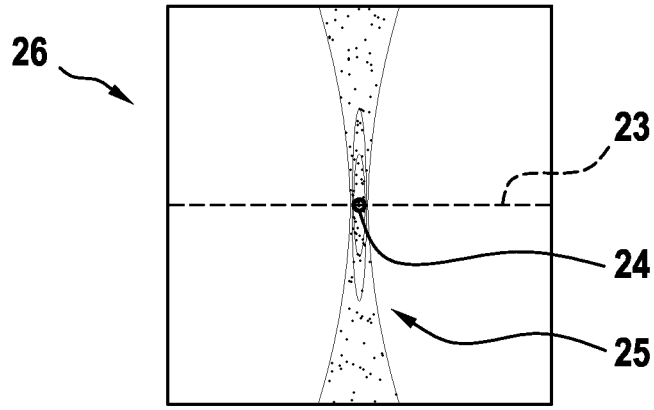
FIG. 4B shows one example of an image of an autofocus measurement.

FIG. 4B shows an image 26 of a focus caustic 25 of the imaging of the gap 21, said focus caustic being reflected at the mask 3 illustrated in FIG. 1 and FIG. 2 and being imaged onto the CCD area sensor S (not illustrated) of the CCD camera (not illustrated) 10. A reference line 23 is depicted in the center of the image 26, which reference line can be obtained from calibration measurements and represents that location at which the caustic center 24 lies given an optimum position of the mask 3 with respect to the focal plane 20. In the image 26 shown in FIG. 4B, the caustic center lies on the reference line 23, that is to say that the mask 3 is positioned optimally in the z-direction. As already mentioned, the position of the reference line 23 can be calibrated in advance, for example by way of the positioning of the mask 3 in the focal plane of the imaging optical unit 9 and the resultant position of the caustic center 24 of the focus caustic 25 in the image. In this case, the focal plane 20 can be determined for example with the aid of an alternative autofocusing method such as the recording of a plurality of images during movement of the object stage 11 in the imaging direction and subsequent determination of the position with the best focus on the basis of the sharpness of the individual images, and the mask 3 can be positioned in the focal plane.

Figure 4C:
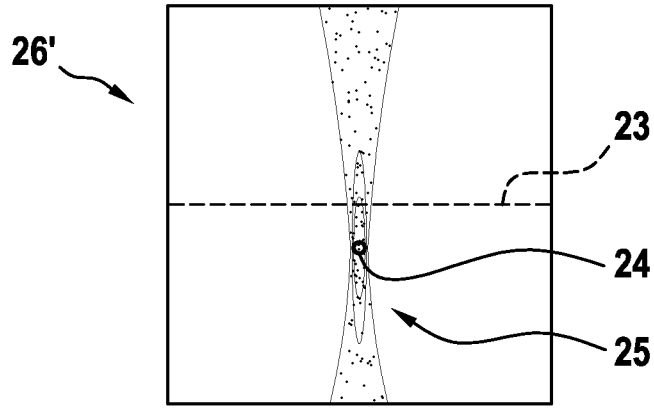
FIG. 4C shows a further example of an image of an autofocus measurement.

FIG. 4C shows an image 26' of the CCD camera 10 (not illustrated), in which the caustic center 24 does not lie on the reference line 23. From the distance between the caustic center 24 of the focus caustic 25 of the imaged gap 21 and the reference line 23, it is possible to determine the distance by which the object stage 11 has to be moved in the z-direction by the movement module 18 in order to position the mask 3 in the focal plane 20.

Figure 5:
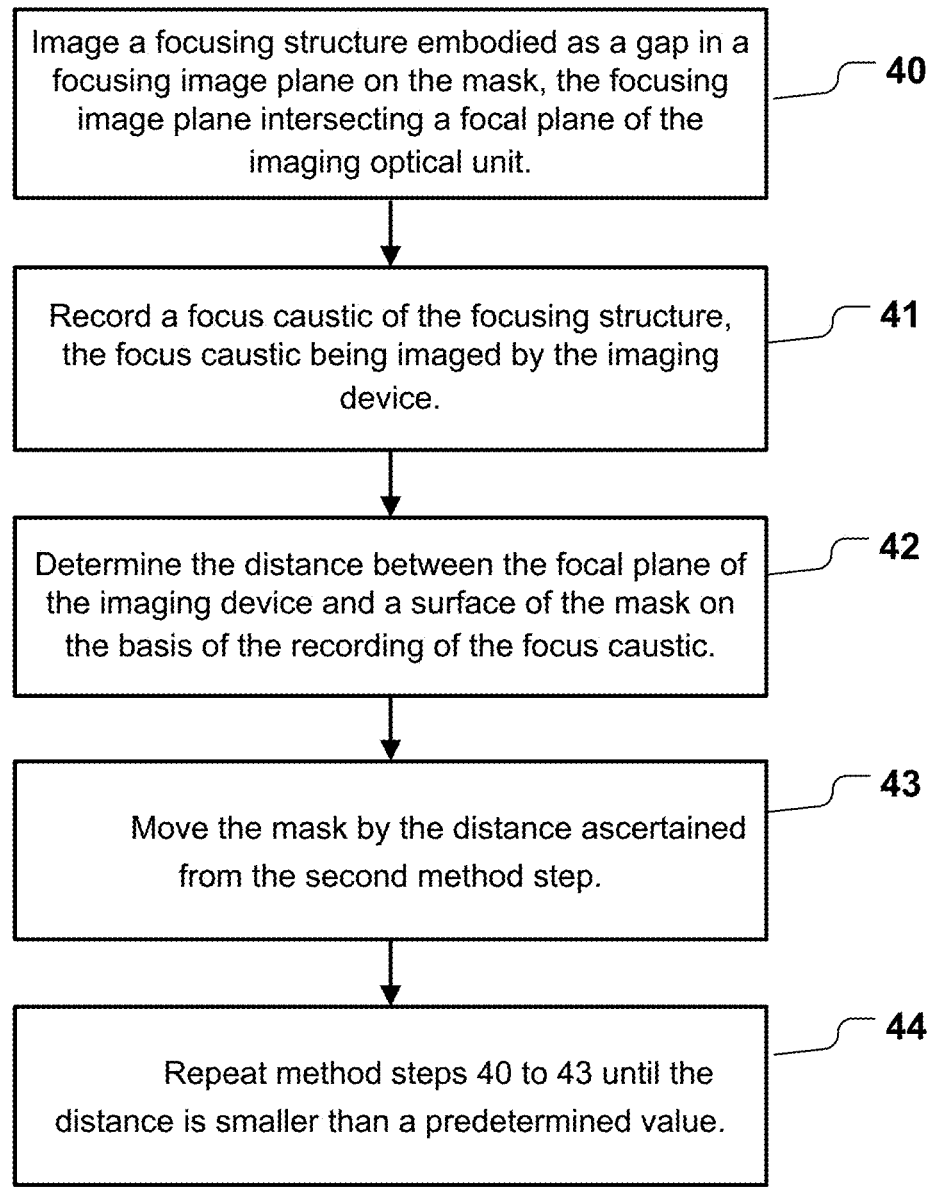
FIG. 5 shows a flow diagram concerning an autofocusing method according to the invention.

FIG. 5 shows a flow diagram of an example of an autofocusing method according to the invention.

In a first method step 40, a focusing structure 13 embodied as a gap is imaged in a focusing image plane 19 on the mask 3, said focusing image plane intersecting a focal plane 20 of the imaging optical unit 9.

In a second method step 41, a focus caustic 25 of the focusing structure 13 is recorded, said focus caustic being imaged by the imaging device 2.

In a third method step 42, the distance between the focal plane 20 of the imaging device 2 and a surface of the mask 3 is determined on the basis of the recording of the focus caustic.

In a fourth method step 43, the mask 3 is moved by the distance ascertained from the second method step 41.

In a fifth method step 44, method steps 40 to 43 are repeated until the distance is smaller than a predetermined value.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

LIST OF REFERENCE SIGNS

1 Autofocusing device
2 Imaging device; microscope
3 Mask
4 Illumination source
5 First deflection mirror
6 Second deflection mirror
7 Imaging objective
8 Tube optical unit
9 Imaging optical unit
10 CCD camera
11 Object stage
12 Third deflection mirror
13 Focusing structure
14 Autofocus optical unit
15 Deflection mirror
16 Deflection mirror
18 Movement module
19 Focusing image plane
20 Focal plane
x, y Spatial direction
S CCD area sensor
21, 21', 21''' Gap
23 Reference line
24 Caustic center
25 Focus caustic
26, 26' Image
30 Device
40 Method step 1
41 Method step 2
42 Method step 3
43 Method step 4
44 Method step 5

What is claimed is:

1. A device for measuring a mask for microlithography, the device comprising:
    an imaging device comprising:
    an imaging optical unit with a focal plane for imaging the mask,
    an object stage for mounting the mask, and
    a movement module for producing a relative movement between object stage and imaging optical unit, and
    an autofocusing device for generating a focusing image by way of the imaging of a focusing structure in a focusing image plane intersecting the focal plane,
    wherein the focusing structure is embodied as a gap that enables light to pass through, in which the gap causes the focusing image to have a focus caustic comprising an at least partly unsharp imaging of the gap, and the autofocusing device is configured to determine a distance between the focal plane of the imaging optical unit and a surface of the mask on the basis of the focus caustic.

2. The device of claim 1, wherein the movement module is configured to move the object stage and the mask and/or the imaging optical unit.

3. The device of claim 2, wherein the movement module is configured to move the object stage and the mask in the imaging plane obliquely, in particular diagonally with respect to the orientation of the imaging of the gap.

4. The device of claim 1, wherein a plurality of gaps are formed in the focusing structure.

5. The device of claim 4, wherein the gaps are arranged in a manner rotated with respect to one another.

6. The device of claim 4, wherein the movement module is configured to move the object stage and the mask and/or the imaging optical unit.

7. An autofocusing method for a device for measuring a mask for microlithography with an imaging device with an imaging optical unit, the method comprising the following steps:
    a) imaging a focusing structure embodied as a gap in a focusing image plane on the mask, the gap enabling light to pass through, said focusing image plane intersecting a focal plane of the imaging optical unit,
    b) recording a focus caustic of the focusing structure that results from step a), the focus caustic comprising an at least partly unsharp imaging of the gap,
    c) determining the distance between the focal plane of the imaging device and a surface of the mask on the basis of the recording of the focus caustic,
    d) moving the mask by the distance ascertained from method step c), and
    e) repeating steps a) to d) until the distance is smaller than a predetermined value.

8. The method of claim 7, wherein a caustic center is determined as a location of the narrowest constriction in the imaged focus caustic of the gap.

9. The method of claim 7, wherein the mask is moved during the focus measurement in a plane perpendicular to the optical axis of the autofocus optical unit obliquely with respect to the orientation of the imaging of the gap.

10. The method of claim 7 in which the focusing structure is embodied as an elongated gap that has a length and a width, the length of the gap is at least twice the width of the gap.

11. The device of claim 1 in which the focusing structure is embodied as an elongated gap that has a length and a width, the length of the gap is at least twice the width of the gap.

12. The method of claim 7, wherein a reference line is formed in the recording of the focus caustic.

13. The method of claim 12, wherein the position of the reference line is determined by an alternative focusing method.

14. The method of claim 7, wherein the imaging of the focus caustic is normalized before the evaluation.

15. The method of claim 14, wherein the normalization is effected by matching the energy per image line of an image of the focus caustic of the gap.

16. The method of claim 7, wherein a caustic center is determined as a location of the highest intensity in the focus caustic of the gap.

17. The method of claim 16, wherein the distance between the surface of the mask and the focal plane is determined from the distance between the caustic center and the reference line.

18. The method of claim 16, wherein a caustic center is determined as a location of the narrowest constriction in the imaged focus caustic of the gap.

19. The method of claim 16, wherein the focusing structure comprises a plurality of gaps and the distance between the focal plane of the imaging device and the surface of the mask is determined by use of an evaluation of the caustic centers of the imagings of the gaps.

20. The method of claim 16, wherein a reference line is formed in the recording of the focus caustic.

21. The method of claim 16, wherein the imaging of the focus caustic is normalized before the evaluation.

22. The device of claim 1 in which the focusing structure comprises a plurality of gaps.

23. The device of claim 22 in which the plurality of gaps comprise a first elongated gap and a second elongated gap at a first side of the first elongated gap, the second elongated gap is rotated with respect to the first elongated gap at an angle in a range from 5 to 90 degrees.

24. The device of claim 23 in which the second elongated gap is rotated with respect to the first elongated gap at an angle in a range from 5 to 45 degrees.

25. The device of claim 23 in which the plurality of gaps comprise a third elongated gap at a second side of the first elongated gap, the third elongated gap is rotated with respect to the first elongated gap at an angle in a range from 5 to 90 degrees.

26. The device of claim 25 in which the second elongated gap is rotated with respect to the first elongated gap at a first angle in a range from 5 to 45 degrees, and the third elongated gap is rotated with respect to the first elongated gap at a second angle in a range from 5 to 45 degrees, the first and second angles are designed to avoid producing Moiré effects during imaging of the focusing structure.

27. The method of claim 7, wherein the focusing structure comprises a plurality of gaps and the distance between the focal plane of the imaging device and the surface of the mask is determined by use of an evaluation of the caustic centers of the imagings of the gaps.

28. The method of claim 27 in which the focusing structure comprises a plurality of gaps.

29. The method of claim 28 in which the plurality of gaps comprise a first elongated gap and a second elongated gap at a first side of the first elongated gap, the second elongated gap is rotated with respect to the first elongated gap at an angle in a range from 5 to 90 degrees.

30. The method of claim 29 in which the second elongated gap is rotated with respect to the first elongated gap at an angle in a range from 5 to 45 degrees.

31. The method of claim 29 in which the plurality of gaps comprise a third elongated gap at a second side of the first elongated gap, the third elongated gap is rotated with respect to the first elongated gap at an angle in a range from 5 to 90 degrees.

32. The method of claim 31 in which the second elongated gap is rotated with respect to the first elongated gap at a first angle in a range from 5 to 45 degrees, and the third elongated gap is rotated with respect to the first elongated gap at a second angle in a range from 5 to 45 degrees, the first and second angles are designed to avoid producing Moiré effects during imaging of the focusing structure.

33. A device for measuring a mask for microlithography, the device comprising:
    an imaging device comprising:
        an imaging optical unit with a focal plane for imaging the mask,
        an object stage for mounting the mask, and
        a movement module for producing a relative movement between object stage and imaging optical unit, and
    an autofocusing device for generating a focusing image by way of the imaging of a focusing structure in a focusing image plane intersecting the focal plane,
    wherein the focusing structure is embodied as a plurality of gaps that enable light to pass through, the plurality of gaps including at least a first gap, a second gap, and a third gap,
    wherein the first gap, the second gap, and the third gap are configured to form a non-periodic pattern designed to avoid producing Moiré effects during imaging of the focusing structure.

34. The device of claim 33 in which the plurality of gaps comprise a plurality of elongated gaps comprising at least a first elongated gap, a second elongated gap, and a third elongated gap,
    wherein the second elongated gap is positioned at a first side of the first elongated gap, the third elongated gap is positioned at a second side of the first elongated gap,
    wherein the second elongated gap is rotated with respect to the first elongated gap at a first angle in a range from 5 to 45 degrees, and the third elongated gap is rotated with respect to the first elongated gap at a second angle in a range from 5 to 45 degrees.

\* \* \* \* \*